United States Patent
Ontalus et al.

(10) Patent No.: US 9,536,989 B1
(45) Date of Patent: Jan. 3, 2017

(54) FIELD-EFFECT TRANSISTORS WITH SOURCE/DRAIN REGIONS OF REDUCED TOPOGRAPHY

(71) Applicant: GLOBALFOUNDRIES INC., Grand Cayman (KY)

(72) Inventors: Viorel Ontalus, Hopewell Junction, NY (US); Annie Lévesque, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/043,917

(22) Filed: Feb. 15, 2016

(51) Int. Cl.
| | |
|---|---|
| *H01L 29/76* | (2006.01) |
| *H01L 29/94* | (2006.01) |
| *H01L 29/66* | (2006.01) |
| *H01L 29/78* | (2006.01) |
| *H01L 21/225* | (2006.01) |
| *H01L 21/324* | (2006.01) |
| *H01L 29/417* | (2006.01) |

(52) U.S. Cl.
CPC ..... *H01L 29/66795* (2013.01); *H01L 21/2253* (2013.01); *H01L 21/324* (2013.01); *H01L 29/41791* (2013.01); *H01L 29/785* (2013.01)

(58) Field of Classification Search
CPC .................. H01L 29/66795; H01L 29/41791; H01L 21/324
USPC .......................................................... 257/401
See application file for complete search history.

(56) References Cited

U.S. PATENT DOCUMENTS

| | | | |
|---|---|---|---|
| 7,871,873 B2 | 1/2011 | Maszara et al. | |
| 8,263,451 B2 | 9/2012 | Su et al. | |
| 8,313,999 B2 | 11/2012 | Cappellani et al. | |
| 8,866,235 B2 | 10/2014 | Wu et al. | |
| 8,937,353 B2 | 1/2015 | Chen et al. | |
| 8,946,029 B2 | 2/2015 | Wong et al. | |
| 9,035,430 B2 | 5/2015 | Vega et al. | |
| 9,117,842 B2 | 8/2015 | Wei et al. | |
| 9,117,908 B2 | 8/2015 | Xie et al. | |
| 9,147,765 B2 | 9/2015 | Xie et al. | |
| 2009/0101978 A1* | 4/2009 | Anderson | H01L 29/785 257/365 |
| 2010/0038685 A1* | 2/2010 | Weber | H01L 21/26506 257/288 |
| 2013/0200455 A1 | 8/2013 | Lo et al. | |
| 2013/0237026 A1 | 9/2013 | Lee et al. | |
| 2014/0349458 A1 | 11/2014 | Wu et al. | |
| 2015/0054039 A1 | 2/2015 | Ching et al. | |

(Continued)

FOREIGN PATENT DOCUMENTS

CN 103247535 8/2013

*Primary Examiner* — Theresa T Doan
(74) *Attorney, Agent, or Firm* — Thompson Hine LLP

(57) ABSTRACT

Device structures and fabrication methods for a fin-type field-effect transistor. A first fin and a second fin are formed that are comprised of a semiconductor material that is single crystal. The first fin has a sidewall facing a sidewall of the second fin. A portion of a source/drain region of the first fin is damaged to form a damage region in the portion of the first fin. After the damage region is formed, a section of a semiconductor layer is epitaxially grown from the sidewall of the first fin in the source/drain region. The semiconductor material in the damage region has a level of crystalline disorder that is greater than a level of crystalline disorder of the semiconductor material in a portion of the first fin that is not damaged.

11 Claims, 4 Drawing Sheets

(56) References Cited

U.S. PATENT DOCUMENTS

| | | |
|---|---|---|
| 2015/0102392 A1 | 4/2015 | Yu et al. |
| 2015/0155306 A1 | 6/2015 | Adam et al. |
| 2015/0155307 A1 | 6/2015 | Adam et al. |
| 2015/0179771 A1 | 6/2015 | Lo et al. |
| 2015/0200260 A1 | 7/2015 | Yu et al. |
| 2015/0200271 A1 | 7/2015 | Lee et al. |
| 2015/0263128 A1 | 9/2015 | Basker et al. |

* cited by examiner

FIELD-EFFECT TRANSISTORS WITH SOURCE/DRAIN REGIONS OF REDUCED TOPOGRAPHY

BACKGROUND

The present invention relates to semiconductor device fabrication and, more specifically, to device structures for a fin-type field-effect transistor (FinFET) and methods for fabricating a device structure for a FinFET.

FinFETs are non-planar device structures that are capable of being more densely packed in an integrated circuit than planar complementary metal-oxide-semiconductor (CMOS) transistors. In addition to the increase in packing density, FinFETs also offer superior short channel scalability, reduced threshold voltage swing, higher mobility, and the ability to operate at lower supply voltages than traditional planar CMOS transistors. A FinFET includes one or more fins of semiconductor material and a gate electrode that intersects a channel of the one or more fins. Heavily-doped source/drain regions are formed in sections of the one or more fins that are not covered by the gate electrode and the channel is centrally located between these heavily-doped source/drain regions.

Improved device structures for a FinFET and fabrication methods for fabricating a device structure for a FinFET are needed.

SUMMARY

According to one embodiment of the present invention, a method is provided for forming a device structure. A first fin and a second fin are formed that are comprised of a semiconductor material that is single crystal. The first fin has a sidewall facing a sidewall of the second fin. A portion of a source/drain region of the first fin is damaged to form a damage region in the portion of the first fin. After the damage region is formed, a section of a semiconductor layer is epitaxially grown from the sidewall of the first fin in the source/drain region. The semiconductor material in the damage region has a level of crystalline disorder that is greater than a level of crystalline disorder of the semiconductor material in a portion of the first fin that is not damaged.

According to another embodiment of the present invention, a device structure includes a fin with a source/drain region and a semiconductor layer including a section on a side surface of the fin in the source/drain region. The section of the semiconductor layer has a surface that is oriented perpendicular to the side surface.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
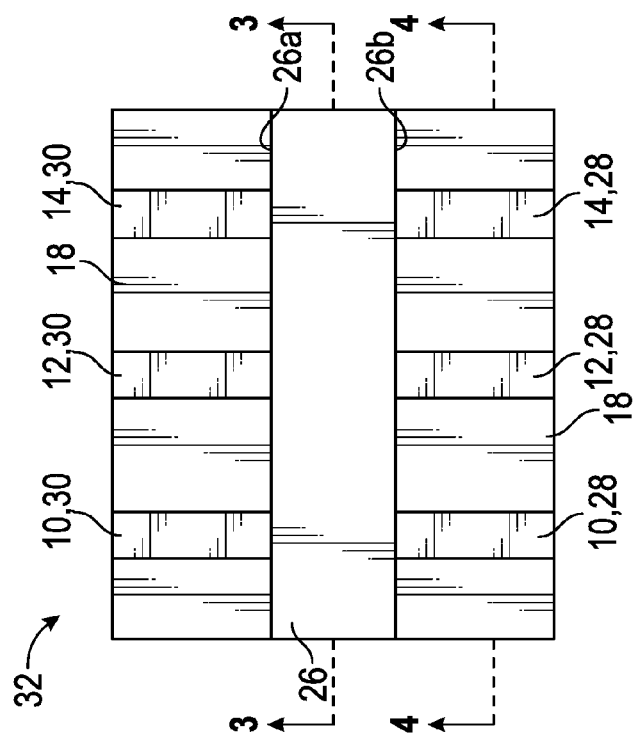
FIG. 1 is a perspective view of a portion of a substrate at an initial fabrication stage of a processing method for forming a device structure from fins in accordance with an embodiment of the invention.
Figure 2:
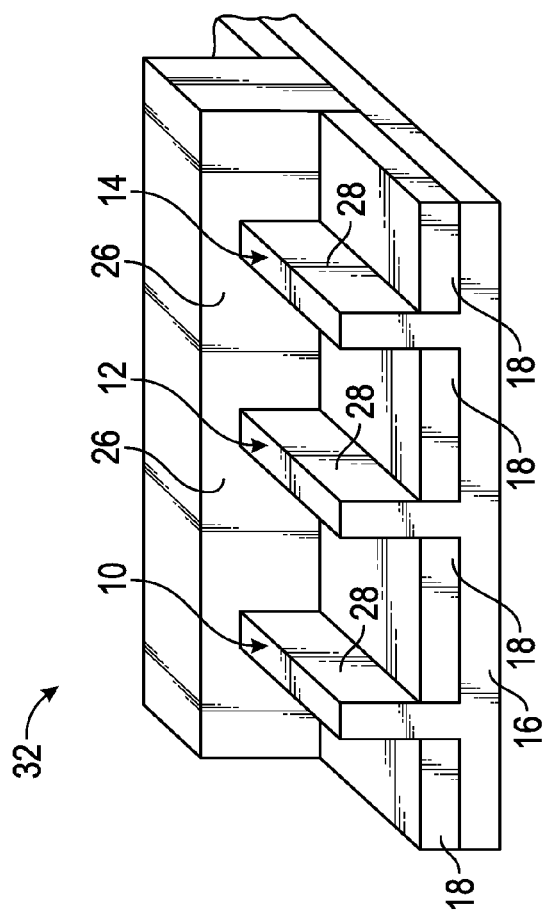
FIG. 2 is a top view of the substrate portion of FIG. 1.
Figure 3:
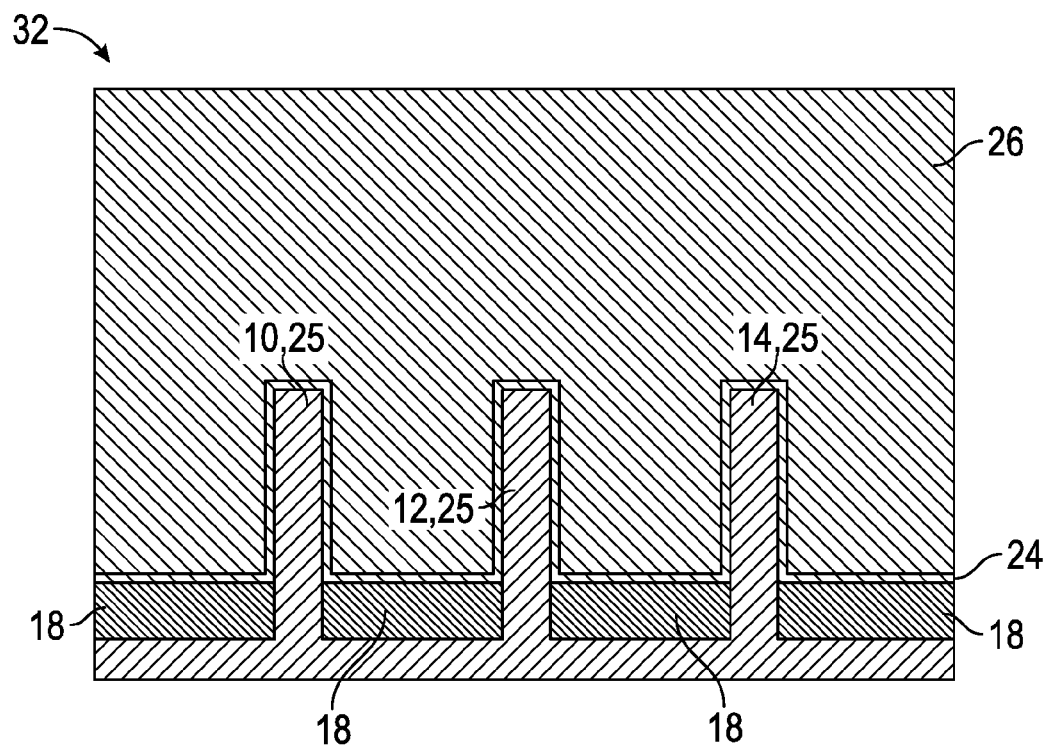
FIG. 3 is a cross-sectional view taken generally along line 3-3 in FIG. 2.

With reference to FIGS. 1-4 and in accordance with an embodiment of the invention, a plurality of fins 10, 12, 14 are formed using semiconductor material originating from a substrate 16. The substrate 16 may be any suitable bulk substrate comprising a single-crystal semiconductor material that a person having ordinary skill in the art would recognize as suitable for forming an integrated circuit. For example, substrate 16 may be comprised of a wafer of a monocrystalline silicon-containing material, such as single crystal silicon with a (100) crystal lattice orientation. The semiconductor material comprising substrate 16 may be lightly doped with an impurity to alter its electrical properties and may also include an optional epitaxial layer. The fins 10, 12, 14 may be comprised of extrinsic semiconductor material or, alternatively, may be comprised of semiconductor material doped to have either p-type conductivity or n-type conductivity.

Fin 10 includes sidewalls 10a,10b, fin 12 includes sidewalls 12a,12b, and fin 14 includes sidewalls 14a,14b. Sidewall 10b is separated from sidewall 12a by an open space or gap of dimension, S, and sidewall 12b is separated from sidewall 14a by a gap or open space of the same dimension. The fins 10, 12, 14 are positioned adjacent to each other, are laterally spaced apart with a given pitch, and may be aligned parallel with each other. The device width for the device structure is a function of the number of fins 10, 12, 14 used in the device structure and may be selected as a design parameter. The size, shape, and configuration of fins 10, 12, 14 may vary depending on device design. In the representative embodiment, the fins 10, 12, 14 have a uniform size, a rectangular shape, and a uniform pitch. However, the size, shape, and pitch may vary as a result of process variations.

The fins 10, 12, 14 may be formed by photolithography and etching processes. To that end, the fins 10, 12, 14 may be formed, for example, using a sidewall image transfer (SIT) process. To that end, a cap layer and a sacrificial layer comprised of, for example, polysilicon may be deposited in a stack on the top surface of the substrate 16 and the sacrificial layer patterned to define mandrels in the region of the substrate 16 used to form the fins 10, 12, 14. Spacers are then formed on the sidewalls of the mandrels. The mandrels are arranged such that the spacers are formed at the intended locations for the fins 10, 12, 14. The mandrels are then removed selective to the spacers using an etching process, such as reactive ion etching (RIE). The cap layer and the substrate 16 are patterned with an etching process, such as reactive ion etching, using one or more etching chemistries and in which the spacers operate as etch masks for forming the fins 10, 12, 14. The spacers and cap layer may be removed subsequent to the etching process so that the exterior surfaces of the fins 10, 12, 14 are exposed.

In an alternative embodiment, the fins 10, 12, 14 may be formed from semiconductor material original from a device layer of a semiconductor-on-insulator (SOI) substrate. The subsequent fabrication stages for fins 10, 12, 14 apply equally to fins 10, 12, 14 formed using the device layer of the semiconductor-on-insulator substrate.

An insulating layer 18 surrounds a lower portion of the fins 10, 12, 14. After the fins 10, 12, 14 are formed, the insulating layer 18 may be formed by depositing an insulating material using a suitable deposition technique, such as silicon dioxide ($SiO_2$) deposited by chemical vapor deposition. In an alternative embodiment, the insulating layer 18 may be omitted from the device structure, in which instance the surface of the substrate 16 between adjacent fins 10, 12, 14 may serve as a reference plane for measuring the fin height.

A gate dielectric 24 and a gate electrode 26 extend across respective channels 25 of the fins 10, 12, 14. The gate electrode 26 includes sidewalls 26a,b that are aligned transverse to the respective sidewalls 10a,10b, 12a,12b, 14a,14b of fins 10, 12, 14, and may be wrapped to interface with multiple surfaces of each of the fins 10, 12, 14. The gate dielectric 24 separates the gate electrode 26 from the fins 10, 12, 14 as an intervening electrically insulating structure. Dielectric spacers (not shown) may be formed on the sidewalls 26a,b of the gate electrode 26.

The gate dielectric 24 may be comprised of an electrical insulator with a dielectric constant (e.g., a permittivity) characteristic of a dielectric material. For example, the gate dielectric 24 may be comprised of silicon dioxide, silicon oxynitride, a high-k dielectric material such as hafnium oxide, or layered combinations of these dielectric materials, deposited by chemical vapor deposition, atomic layer deposition (ALD), etc. The gate electrode 26 may be comprised of an electrical conductor, such as a metal, a silicide, doped polycrystalline silicon (e.g., polysilicon), or a combination of these materials deposited by physical vapor deposition (PVD), chemical vapor deposition, etc.

The gate dielectric 24 and gate electrode 26 may be formed by patterning a deposited layer stack of their constituent materials using photolithography and etching processes. To provide the patterning, a mask layer may be applied on a top surface of the layer stack and patterned with photolithography. The mask layer may comprise a photosensitive material, such as a photoresist, that is applied by spin coating, pre-baked, exposed to light projected through a photomask, baked after exposure, and developed with a chemical developer. A section of the mask layer covers the layer stack at the intended location of the gate electrode 26 and functions as an etch mask. An etching process is used, with the mask layer present, to form the gate dielectric 24 and the gate electrode 26 from the layer stack. The etching process may be selected to remove the materials of the layer stack selective to (i.e., at a higher etch rate than) the material of the fins 10, 12, 14. The etching process may be conducted in a single etching step or multiple steps, and may rely on one or more etch chemistries. The mask layer may be removed following the etching process. If comprised of a photoresist, the mask layer may be removed by ashing or solvent stripping, followed by a cleaning process. A gate cap (not shown) may be formed on the gate electrode 26 from a dielectric layer (e.g., silicon nitride) added to the layer stack and patterned along with the gate dielectric 24 and gate electrode 26.

The gate dielectric 24, gate electrode 26, source/drain regions 28, 30, and channels 25 are features of a device structure 32 formed using the fins 10, 12, 14 and having the form of a fin-type field-effect transistor (FinFET). Other features of the device structure 32 may be omitted from the drawings for purposes of illustration. The source/drain regions 28, 30 protrude from opposite sidewalls 26a,b of the gate electrode 26 and are not covered by the gate electrode 26. Each pair of source/drain regions 28, 30 is separated from each other by one of the channels 25. When a gate voltage is applied to the gate electrode 26, a depletion/inversion layer is formed in the channel 25 that permits carrier flow between the source/drain regions 28, 30 as an output current. The fins 10, 12, 14 define three-dimensional bodies of semiconductor material originating from the substrate 16 and have a height H, a width W, and an axial length that corresponds to the direction of current travel when the FinFET is operational.

Figure 4:
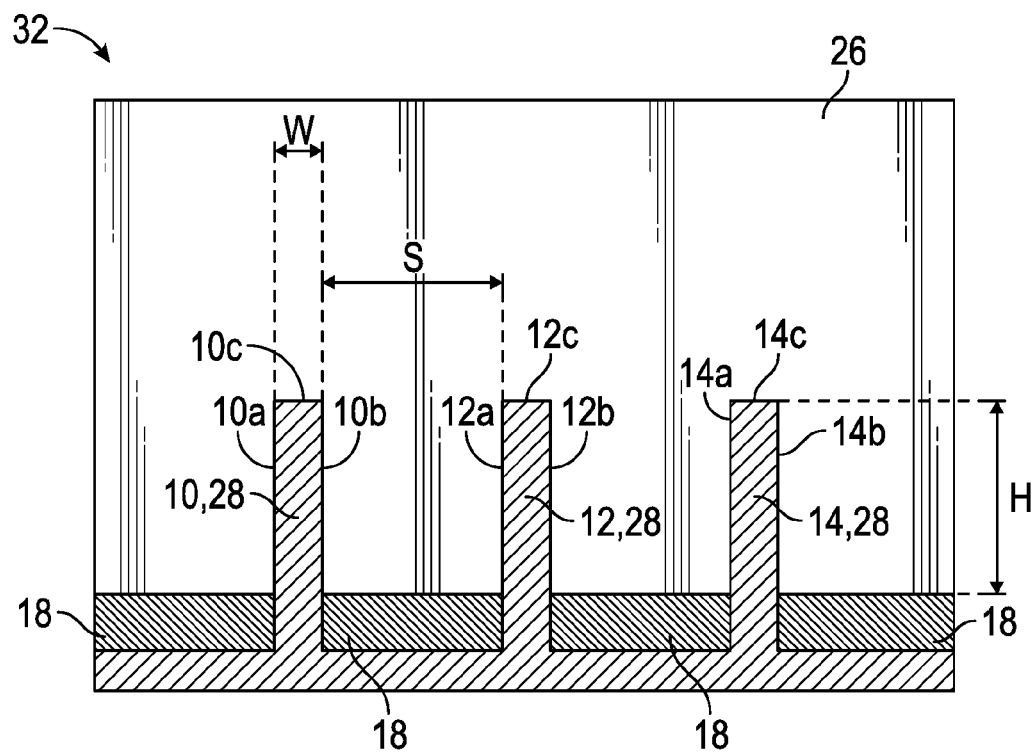
FIG. 4 is a cross-sectional view taken generally along line 4-4 in FIG. 2.
Figure 5:
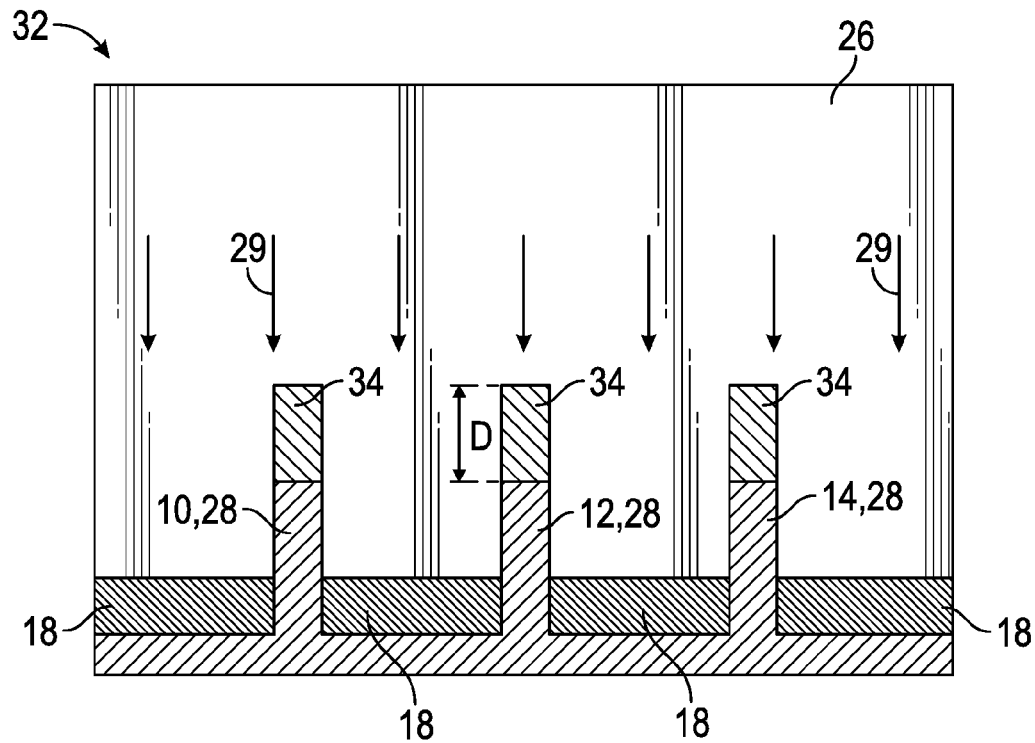
FIG. 5 is a cross-sectional view similar to FIG. 4 at a subsequent fabrication stage of the processing method.

With reference to FIG. 5 in which like reference numerals refer to like features in FIG. 4 and at a subsequent fabrication stage, a damage region 34 is formed in the semiconductor material of the source/drain regions 28, 30 of each of the fins 10, 12, 14. Each of the damage regions 34 may be formed by implanting energetic ions, which are indicated diagrammatically by singled-headed arrows 29, with selected implantation conditions (e.g., ion species, dose, kinetic energy, angle of incidence) into the fins 10, 12, 14.

The ions 29 may be generated from a suitable source gas using an ion implantation tool and are introduced into the fins 10, 12, 14. In an embodiment, the ions 29 may comprise an ion species with a mass that is greater than or equal to the mass(es) of atoms comprising the constituent semiconductor material of the fins 10, 12, 14. In an embodiment, the ions 29 may comprise an ion species selected from silicon (Si), germanium (Ge), argon (Ar), xenon (Xe), or some combination thereof. In an embodiment, the ions 29 may comprise heavy or medium heavy atoms. In an embodiment, the ions 29 may comprise an ion species, such as carbon (C), that is less massive than the mass(es) of atoms comprising the constituent semiconductor material of the fins 10, 12, 14.

If the ions 29 are comprised of germanium and a high dose of germanium is implanted, the composition of fins 10, 12, 14 formed from silicon may be modified to a silicon-germanium alloy with a germanium content greater than 1%. In an embodiment, the germanium concentration (i.e., the ratio of the Ge content to the Ge and Si content) in the SiGe layers of the damage regions 34 may be in a range between 1 and 5 percent. The addition of germanium to the fin composition may increase the solid solubility of electrically-active dopant (e.g., boron) introduced into the fins 10, 12, 14, and may reduce dopant diffusion so as to produce sharper p-n junctions.

The vertical extent of the damage regions 34 (i.e., vertical distance D) in the source/drain regions 28, 30 may be dependent on implantation conditions such as ion kinetic energy and ion mass. The vertical distance, which may be measured relative to the respective top surfaces 10c, 12c, 14c, is less than the height H of the fins 10, 12, 14. In the representative embodiment, the damage regions 34 are located in the top or upper portion of the fins 10, 12, 14 in the source/drain regions 28, 30. In an embodiment, the damage regions 34 may be located in the top or upper portion of the fins 10, 12, 14 in the source/drain regions 28, 30 such that the vertical distance is equal to one half of the fin height. The damage regions 34 may extend across the entire width of the fins 10, 12, 14 in the source/drain regions 28, 30.

The damage regions 34 in the source/drain regions 28, 30 of fins 10, 12, 14 are characterized by a reduced level of crystallinity compared with the original state of the single crystal semiconductor material. The damage regions 34 may exhibit various different levels of crystalline disorder or damage. For example, the damage regions 34 may be comprised of partially-amorphized semiconductor material, while the lower portions of the fins 10, 12, 14 below the respective damage regions 34 remain single crystal semiconductor material and are not damaged. The lower portions of the fins 10, 12, 14 include negligible, if any damage, caused by the ion implantation. These lower portions of the fins 10, 12, 14, which may retain the original crystal structure, provide a recrystallization seed during the subsequent thermal process used to alleviate the lattice damage.

Figure 5A:
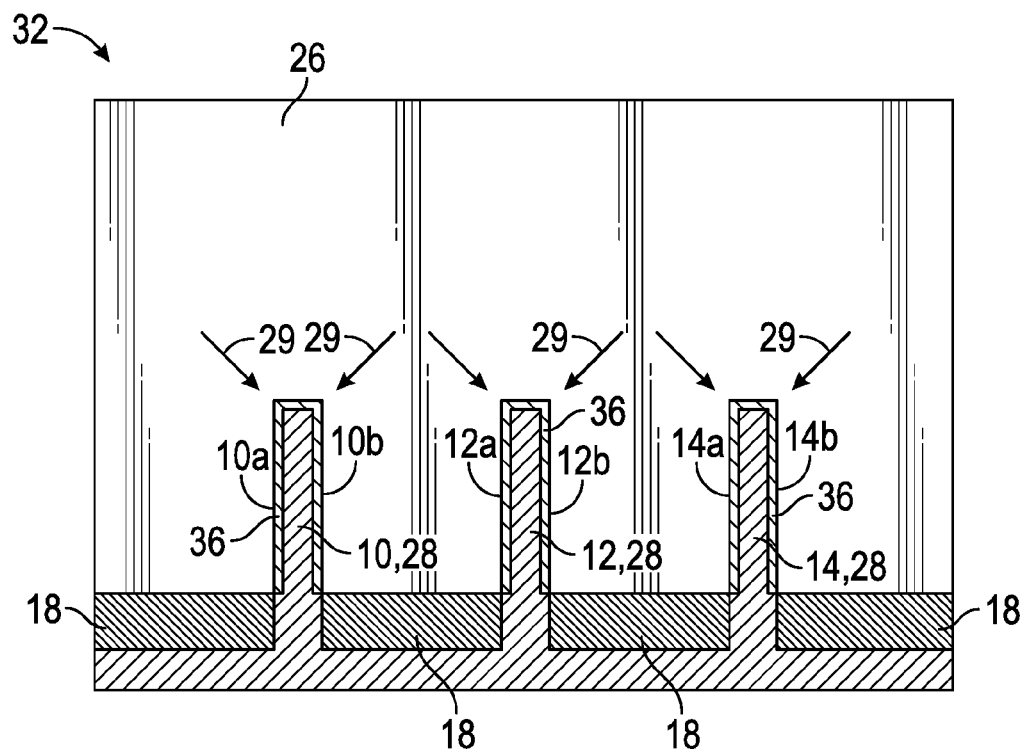
FIG. 5A is a cross-sectional view similar to FIG. 5 in accordance with an alternative embodiment of the invention.

With reference to FIG. 5A in which like reference numerals refer to like features in FIG. 4 and at a subsequent fabrication stage in accordance with an alternative embodiment of the invention, the damage regions may have the form of surface layers 36 that extend inwardly into the fins 10, 12, 14 from the sidewalls 10a,10b, 12a,12b, 14a,14b by a distance that is less than the full width of the fins 10, 12, 14. The surface layers 36 may extend over the full height of the fins 10, 12, 14 in the source/drain regions 28, 30. A core of the fins 10, 12, 14, which is surrounded in each instance by the damaged surface layers 36, remains single crystal and may serve as a recrystallization seed during the subsequent thermal process used to reduce the lattice damage introduced by implantation.

The surface layers 36 providing the damage regions in the source/drain regions 28, 30 may be produced by changing the implantation angle for the ions 29 from a normal angle of incidence as depicted in FIG. 5 to a non-normal angle of incidence as diagrammatically indicated by the single headed arrows in FIG. 5A. In particular, the trajectories of the ions 29 for such an angled implantation may impinge the sidewalls 10a,10b, 12a,12b, 14a,14b, as well as the top surfaces 10c, 12c, 14c, in the source/drain regions 28, 30. As used herein, the term "angled implantation" denotes that the ion trajectories are directed at incident angles different than 0°, wherein 0° represents a direction normal (i.e., vertical) relative to a plane containing the top surfaces 10c, 12c, 14c of the fins 10, 12, 14 (i.e., the top surface of substrate 16). Multiple angled implantations with the substrate 16 rotated by an angle of 180°, as diagrammatically indicated by the single-headed arrows of different inclinations in FIG. 5A, may be needed to create the surface layers 36 providing the damage regions in the fins 10, 12, 14. For example, an angled implantation may be used to implant sidewalls 10a, 12a, 14a, followed by rotating the substrate by 180° and then another angled implantation of sidewalls 10b, 12b, 14b.

Figure 6:
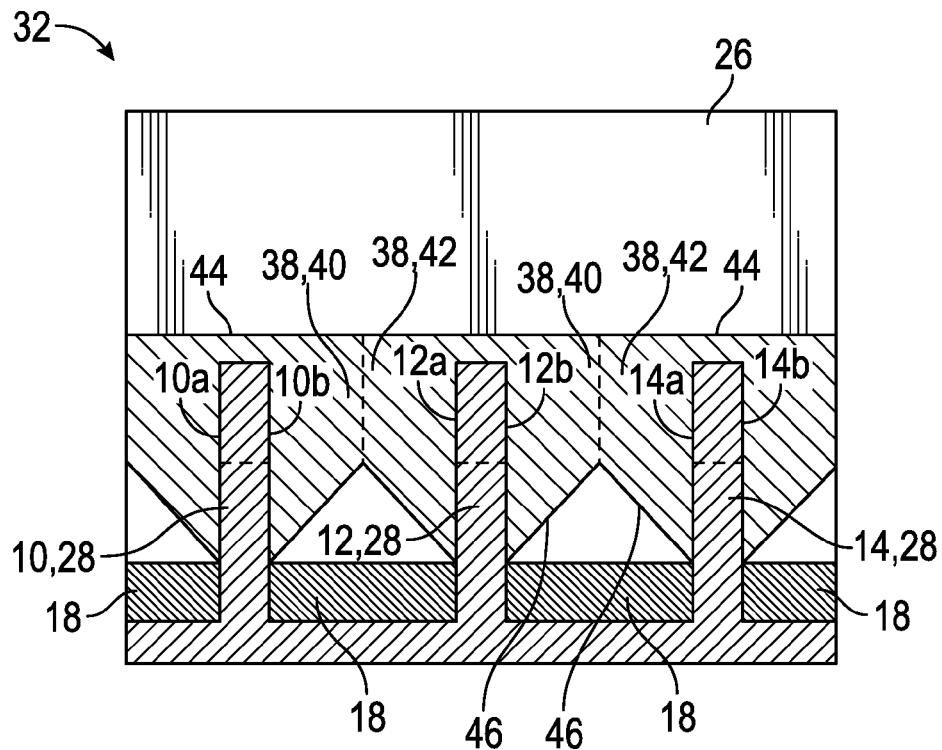
FIG. 6 is a cross-sectional view similar to FIG. 5 at a subsequent fabrication stage of the processing method.

With reference to FIG. 6 in which like reference numerals refer to like features in FIG. 5 and at a subsequent fabrication stage, a thermal process (e.g., an anneal) may be used to partially alleviate the damage to (i.e., recrystallize or regrow) the semiconductor material of the damage regions 34 in the source/drain regions 28, 30 of the fins 10, 12, 14. The resulting repaired damage regions 35, after thermal processing, are diagrammatically indicated on FIG. 6 by the portion of the fins 10, 12, 14 above the horizontal dashed line. The portion of the fins 10, 12, 14 below the horizontal dashed line provides the crystalline template for the partial repair of the damage.

The thermal process is selected and controlled such that the repaired semiconductor material of the fins 10, 12, 14 in the source/drain regions 28, 30 does not return to its pre-implanted single-crystal state and is only partially repaired. The thermal process reduces the level of crystalline disorder in the damage regions 34 may be reduced, and thereby increases the crystallinity of the semiconductor material in the repaired damage regions 35, by recrystallization that repairs at least some, but not all, of the crystalline damage imparted by implantation. An exemplary thermal process may be performed in a reducing atmosphere (e.g., hydrogen) and at a temperature ranging from 700° C. to 800° C. for a duration sufficient to provide the partial alleviation of the crystalline damage.

A semiconductor layer 38 may be formed that includes sections 40 that form on the sidewalls 10b, 12b, 14b of the fins 10, 12, 14 in the source/drain regions 28, and sections 42 that form on the sidewalls 10a, 12a, 14a of the fins 10, 12, 14 in the source/drain regions 28. The semiconductor layer 38 includes sections (not shown) similar to sections 40, 42 on the sidewalls 10a,10b, 12a,12b, 14a,14b of the fins 10, 12, 14 in the source/drain regions 30. The semiconductor layer 38 is formed after the thermal process reducing the level of crystalline disorder of the damage regions 34 and form repaired damage regions 35 is performed. The sidewalls 10a,10b, 12a,12b, 14a,14b may be cleaned before forming the semiconductor layer 38 thereon.

The semiconductor layer 38 is comprised of a semiconductor material (e.g., silicon-germanium or silicon) epitaxially grown or deposited using a low temperature epitaxial growth process, such as vapor phase epitaxy, and may be single-crystal or monocrystalline. The epitaxial semiconductor material may include a concentration of an electrically-active dopant (e.g., boron) introduced by in situ doping during growth. In an embodiment, the semiconductor layer 38 may be formed by a selective epitaxial growth process in which semiconductor material nucleates for epitaxial growth on semiconductor surfaces, but does not nucleate for epitaxial growth from insulator surfaces.

During growth, a growth front for the different sections 40 of semiconductor layer 38 initiates on the sidewalls 10b, 12b, 14b in the source/drain regions 28, 30 and the semiconductor material at the sidewalls 10b, 12b, 14b serves as a growth template. Similarly, a growth front for the different sections 42 of semiconductor layer 38 initiates on the sidewalls 10a, 12a, 14a in the source/drain regions 28, 30 and the semiconductor material at the sidewalls 10a, 12a, 14a serves as a growth template. The growth fronts of the sections 40, 42 respectively advance from sidewall 10b of fin 10 and sidewall 12a of fin 12 into the open space between fin 10 and fin 12. Likewise, the growth fronts of the sections 40, 42 respectively advance from sidewall 12b of fin 12 and sidewall 14a of fin 14 into the open space between fin 12 and fin 14.

The growth fronts for the semiconductor layer 38 that initiate from portions of the sidewalls 10a,10b, 12a,12b, 14a,14b coextensive with the repaired damage regions 35 are randomized to include a mixture of fast and slow crystallographic growth planes that are located adjacent to each other. Due to this randomization of the crystallographic growth planes, epitaxial growth rates for these growth fronts are no longer limited by the slowest crystallographic growth plane and merging of adjacent sections 40, 42 can occur, as discussed below. As a result, the sections 40 of semiconductor layer 38 located on sidewalls 10a,10b, 12a,12b, 14a,14b have respective top or upper surfaces 44 in a plane that is oriented perpendicular to (i.e., normal or orthogonal to) respective planes containing the sidewalls 10a,10b, 12a, 12b, 14a,14b of fins 10, 12, 14. The upper surfaces 44 are not angled or inclined relative to the planes of the sidewalls 10a,10b, 12a,12b, 14a,14b of fins 10, 12, 14, and may be coplanar with or in a plane parallel to the top surfaces 10c, 12c, 14c of the fins 10, 12, 14. The effective result is a reduction in the topography at these top surfaces.

The growth fronts may eventually intersect and the upper portions of adjacent sections 40, 42 may merge together within the inter-fin space, as indicated by the vertical dashed lines in FIG. 6. Merger is improved by the change in the shape of the sections 40, 42 in which the upper surfaces 44 are not inclined. In an alternative embodiment, the epitaxial growth process may be limited so that adjacent sections 40, 42 are not contacting and do not merge.

In the representative embodiment, the sections 40, 42 have bottom or lower surfaces 46 that are angled (i.e., slanted or inclined at an angle other than 90°) relative to the planes of the sidewalls 10a,10b, 12a,12b, 14a,14b of fins 10, 12, 14. The repaired damage regions 35, which do not extend over the full height of the fins 10, 12, 14, do not influence the epitaxial growth of the semiconductor layer 38 from the lower portions of the fins 10, 12, 14, which is instead limited by the slowest crystallographic growth plane and causes the angling of the lower surfaces 46. A gap is present beneath the sections 40, 42 and a topmost surface of the insulating layer 18.

The sections 40, 42 of semiconductor layer 38 have a truncated geometrical shape in which the upper surfaces 44 and lower surfaces 46 are not in parallel planes. The sections 40, 42 of semiconductor layer 38 lack the triangular or diamond shape characteristic of epitaxial growth that is limited by the slowest crystallographic growth plane over the entirety of the sidewalls 10a,10b, 12a,12b, 14a,14b, and in which both the top and bottom surfaces would be inclined relative to the fin side surfaces.

In an alternative embodiment, the post-implantation thermal process may be omitted before the semiconductor layer 38 is epitaxially grown.

After the semiconductor layer 38 is formed, an additional post-epitaxy anneal can be used to more fully repair the crystallinity of the semiconductor material of the repaired damage regions 35 in the source/drain regions 28, 30 and, in an embodiment, may restore the semiconductor material to its original single crystal state. The post-epitaxy anneal may be performed at a higher temperature and/or for a longer anneal time than the thermal process used to partially recover the crystallinity of the damage regions 34 and thereby form repaired damage regions 35 prior to epitaxial growth. The source/drain regions 28, 39 of the fins 10, 12, 14 may be converted to a crystalline state or, at the least, to a state that is characterized by a low resistance. The post-epitaxy anneal may also prompt thermal diffusion of dopant from the semiconductor layer 38 into the source/drain regions 28, 30 of the fins 10, 12, 14 in order to introduce an electrically-active dopant that reduces the electrical resistance of the source/drain regions 28, 30.

Standard middle-of-line (MOL) processing and back-end-of-line (BEOL) processing follows, which includes formation of dielectric layers, via plugs, and wiring for an interconnect structure coupled with the device structure 32.

Figure 6A:
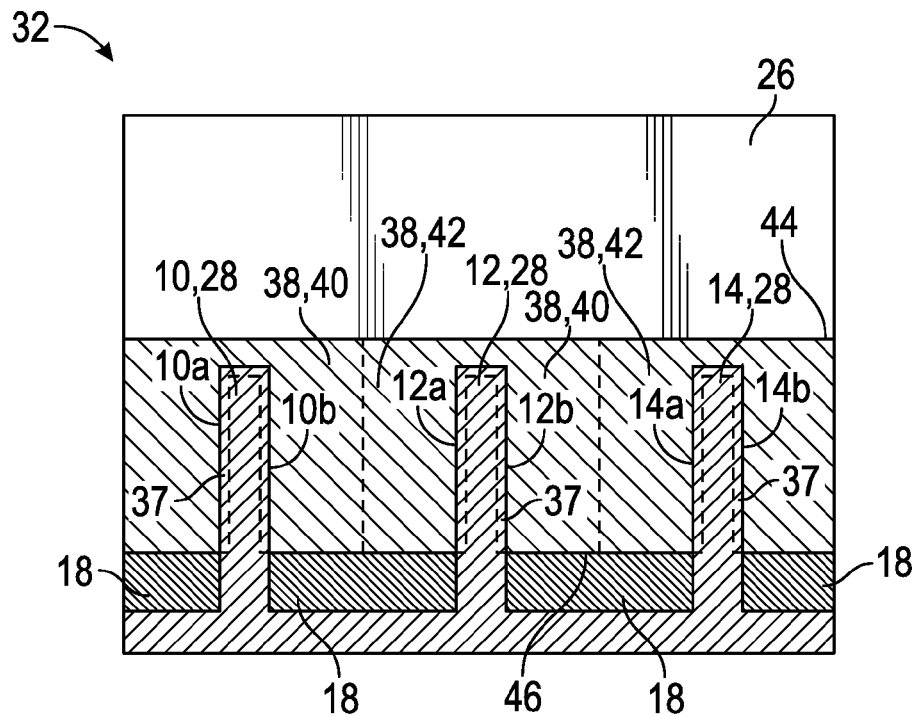
FIG. 6A is a cross-sectional view similar to FIG. 5A at a subsequent fabrication stage of the processing method in accordance with the alternative embodiment.

With reference to FIG. 6A in which like reference numerals refer to like features in FIG. 5A and at a subsequent fabrication stage in accordance with an alternative embodiment of the invention, the surface layers 36 are partially recovered (e.g., repaired) by the performance of the thermal process to form repaired surface layers 37, as discussed above for the transformation of damage regions 34 to repaired damage regions 35. The semiconductor layer 38 is epitaxially grown from the repaired surface layers 37. The repaired surface layers 37 are diagrammatically indicated by the regions of the fins 10, 12, 14 between the sidewalls 10a,10b, 12a,12b, 14a,14b and the vertical dashed lines in FIG. 6A.

The result is that the epitaxial growth of the sections 40, 42 of the semiconductor layer 38 over the entire height of the sidewalls 10a,10b, 12a,12b, 14a,14b (i.e., the upper and lower sections of fins 10, 12, 14) is not limited by the slowest crystallographic growth plane, and merger may be improved over the entire fin height. The lower surfaces 46 and the upper surfaces 44 are contained in planes oriented perpendicular to (i.e., normal or orthogonal to) respective planes containing the sidewalls 10a,10b, 12a,12b, 14a,14b of fins 10, 12, 14. The upper and lower surfaces 44, 46 are not angled or inclined relative to the planes of the sidewalls 10a,10b, 12a,12b, 14a,14b of fins 10, 12, 14. The upper surfaces 44 may be coplanar with or in a plane parallel to the top surfaces 10c, 12c, 14c of the fins 10, 12, 14, and the plane of lower surfaces 46 may be parallel to the plane of the upper surfaces 44.

The recovered damage regions 35 and surface layers 37 may function to improve the characteristics of the semiconductor layer 38 and, in particular, to change the shape of the sections 40, 42 of the semiconductor layer 38. The more isotropic growth front profile may lead to more uniformly merged sections 40, 42, of the semiconductor layer 38. It may also reduce the variability due to pitch walking of the fins as compared with growth limited by slowest crystallographic growth planes. Pitch walking is an unwanted effect resulting from process variations during fin formation and in which the fins 10, 12, 14 are fabricated with a non-uniform pitch.

The increased area provided by the surfaces 46 of the merged sections 42, 44 of the semiconductor layer 38 is achieved without increasing the growth time. Merger can be achieved without increasing the height of the fins 10, 12, 14 or growing the semiconductor layer 38 with epitaxial growth conditions that are less selective and/or more prone to introducing defects. The increased surface area at the surfaces 46 may promote a reduction in contact resistance and spreading resistance relative to contacts landing on the source/drain regions 28, 30. The resistance reduction may be achieved without any non-selective defect penalty.

In an embodiment in which fins 10, 12, 14 comprised of silicon are implanted with germanium ions 29 in an angled implantation, the resulting surface layer following anneal serves as a template for subsequent growth of the epitaxial semiconductor material (e.g., silicon-germanium heavily doped with boron) of semiconductor layer 38. This surface layer may eliminate the need for a buffer layer of silicon or silicon-germanium on the fin surfaces that is commonly used to initiate epitaxial growth by reducing lattice mismatch between the fins and the epitaxial layer.

The implantation of ions 29 may clean contaminants from the sidewalls 10a,10b, 12a,12b, 14a,14b of the fins 10, 12, 14. The sidewall cleaning due to the implantation may be effective to reduce nucleation delay during epitaxial growth of the semiconductor layer 38. This contribution to the contaminant cleaning process may help reduce the nucleation delay and may consequently increase the epitaxy volume obtained for the same growth time. Thus, the implantation cleaning may further promote the ability to eliminate a buffer layer on the fin surfaces to cover and conceal contamination that could otherwise interfere with epitaxial growth. The implantation may also modify any native oxide on the exterior surfaces of the fins 10, 12, 14 in a manner that enhances chemical removal.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either an intermediate product, such as a motherboard, or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a device structure, the method comprising:
   forming a first fin and a second fin comprised of a semiconductor material that is single crystal, the first fin having a sidewall facing a sidewall of the second fin;
   forming a first damage region in a portion of a source/drain region of the first fin; and
   after the first damage region is formed, epitaxially growing a first section of a semiconductor layer from the sidewall of the first fin in the source/drain region,
   wherein the semiconductor material in the first damage region has a level of crystalline disorder that is greater than a level of crystalline disorder of the semiconductor material in a portion of the first fin that is not damaged.

2. The method of claim 1 further comprising:
   thermally processing the first damage region to reduce the level of crystalline disorder in the first damage region.

3. The method of claim 2 wherein the first damage region is thermally processed before the semiconductor layer is epitaxially grown.

4. The method of claim 1 wherein forming the first damage region in the portion of the source/drain region of the first fin comprises:
   implanting ions into the first fin to form the first damage region.

5. The method of claim 4 wherein implanting the ions into the first fin comprises:
   directing trajectories of the ions at an angle into the sidewall of the first fin.

6. The method of claim 4 wherein the semiconductor material comprises silicon, the ions comprise germanium, and the first damage region is a surface layer located proximate to the sidewall of the first fin and comprised of silicon-germanium.

7. The method of claim 4 further comprising:
   implanting the ions into the second fin to form a second damage region in a source/drain region of the second fin; and
   after the second damage region is formed, epitaxially growing a second section of the semiconductor layer from the sidewall of the second fin in the source/drain region of the second fin,
   wherein the first section of the semiconductor layer merges with the second section of the semiconductor layer, and the epitaxial growth during merger is not limited by a slow growth rate plane.

8. The method of claim 7 wherein the first section of the semiconductor layer has a first surface that is oriented perpendicular to the sidewall of the first fin, and the second section of the semiconductor layer has a second surface that is coplanar with the first surface of the first section of the semiconductor layer.

9. The method of claim 4 wherein the first fin includes a top surface that is connected with the sidewall, and implanting the ions into the first fin comprises:
   directing trajectories of the ions vertically into the top surface of the first fin.

10. The method of claim 4 further comprising:
    forming a second damage region in a portion of a source/drain region of the second fin; and
    after the second damage region is formed, epitaxially growing a second section of the semiconductor layer from the sidewall of the second fin in the source/drain region,
    wherein the semiconductor material in the second damage region has a level of crystalline disorder that is greater than a level of crystalline disorder in a portion of the second fin that is not damaged.

11. The method of claim 10 wherein the first section of the semiconductor layer merges with the second section of the semiconductor layer, and the epitaxial growth during merger is not limited by a slow growth rate plane.

* * * * *